US007999709B2

(12) United States Patent  
Oliaei (10) Patent No.: US 7,999,709 B2
(45) Date of Patent: Aug. 16, 2011

(54) CONTINUOUS-TIME IMAGE-REJECT FILTER WITH DISCRETE-TIME FEEDBACK

(75) Inventor: Omid Oliaei, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 12/534,650

(22) Filed: Aug. 3, 2009

(65) Prior Publication Data

US 2011/0025539 A1   Feb. 3, 2011

(51) Int. Cl.
*H03M 3/00* (2006.01)
(52) U.S. Cl. ......... 341/143; 341/144; 341/118; 341/120
(58) Field of Classification Search .................. 341/143, 341/144
See application file for complete search history.

(56) References Cited

U.S. PATENT DOCUMENTS

| | | | | |
|---|---|---|---|---|
| 5,087,914 A * | 2/1992 | Sooch et al. | ................... | 341/120 |
| 6,177,896 B1 * | 1/2001 | Min | ................ | 341/143 |
| 6,384,761 B1 * | 5/2002 | Melanson | .................... | 341/143 |
| 6,404,369 B1 * | 6/2002 | Sheen | .................. | 341/143 |
| 6,501,409 B1 * | 12/2002 | Lynn et al. | .................... | 341/150 |
| 7,026,970 B2 * | 4/2006 | Wang et al. | .................... | 341/143 |
| 7,098,830 B2 | 8/2006 | Lin et al. | | |
| 7,277,035 B1 * | 10/2007 | You et al. | ....................... | 341/144 |
| 7,414,558 B2 * | 8/2008 | Rivoir et al. | .................. | 341/144 |
| 7,659,841 B1 * | 2/2010 | Newell | .......................... | 341/120 |
| 2007/0222655 A1 | 9/2007 | Schoner | | |
| 2009/0016544 A1 * | 1/2009 | Li et al. | ........................ | 381/94.1 |
| 2009/0195426 A1 * | 8/2009 | Ballantyne | .................... | 341/144 |

OTHER PUBLICATIONS

Peev, P., et al, "An Anti-Aliasing Filter Inspired by Continuous-Time Sigma Delta Modulation," IEEE International Symposium on Circuits and Systems, May 2008, pp. 854-857.
Su, D., "A CMOS Oversampling D/A Converter with a Current-Mode Semi-Digital Reconstruction Filter," IEEE J. Solid-State Circuits, vol. 28,pp. 1224-1233, Dec. 1993.
Oliaei, O., Design of continuous-time sigma-delta modulators with arbitrary feedback waveform, IEEE Transactions on Circuits and Systems II: Analog and Digital Signal Processing, vol. 50, Aug. 2003, pp. 437-444.
Shoaei, O., Continuous-Time Delta-Sigma A/D Converters for High Speed Applications, Ph.D. Thesis, Carleton University, 1995.

* cited by examiner

*Primary Examiner* — Linh Nguyen
(74) *Attorney, Agent, or Firm* — Ingrassia Fisher & Lorenz, P.C.

(57) ABSTRACT

Apparatus are provided for converting a discrete-time analog signal to a continuous-time analog signal. A module comprises a digital-to-analog converter and a filtering arrangement coupled between the digital-to-analog converter and an output node. The digital-to-analog converter converts a digital signal to a discrete-time analog signal. The filtering arrangement comprises a forward signal arrangement having an input configured to receive the discrete-time analog signal and a feedback signal arrangement coupled to the forward signal arrangement. The feedback signal arrangement generates a discrete-time feedback signal at the input of the forward signal arrangement based on one or more continuous-time analog signals from the forward signal arrangement. The forward signal arrangement generates the continuous-time analog output signal at the output node based on a difference between the discrete-time analog signal and the discrete-time feedback signal.

20 Claims, 4 Drawing Sheets

CONTINUOUS-TIME IMAGE-REJECT FILTER WITH DISCRETE-TIME FEEDBACK

TECHNICAL FIELD

Embodiments of the subject matter described herein relate generally to mixed-signal circuits, and more particularly, embodiments of the subject matter relate to image rejection filters.

BACKGROUND

In many modern electronics applications, it is desirable to convert a digital signal to an analog signal. Most digital-to-analog converters convert a digital signal to a discrete-time analog signal with a particular sampling frequency. In the frequency domain, the spectrum of the discrete-time analog signal includes a baseband component centered around zero-frequency with images of the baseband component being aliased to integer multiples of the sampling frequency. It is desirable that the images of the baseband component that are aliased to integer multiples of the sampling frequency be highly attenuated to prevent the images from being perceived as high-frequency noise. This is often achieved by using a continuous-time filter to interpolate the discrete-time samples to remove the images.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting. For example, terms such as "first", "second" and other such numerical terms referring to structures do not imply a sequence or order unless clearly indicated by the context.

For the sake of brevity, conventional techniques related to signal processing, sampling, filtering, digital-to-analog conversion, circuit design and/or implementation, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material.

Technologies and concepts discussed herein relate to systems for filtering discrete-time analog signals to achieve continuous-time analog signals with desired image rejection and/or attenuation and a desired phase response. One or more continuous-time analog signals from the filtering arrangement are sampled to create a discrete-time feedback signal which is subtracted from the discrete-time analog input signal at the input of the filtering arrangement. The filtering arrangement is capable of achieving high levels of attenuation and notches having relatively large bandwidths, allowing a reduction in the order of the filter and/or a reduction in the sampling frequency. As a result, the filter has reduced power consumption and/or a reduced cost of implementing.

Figure 1:
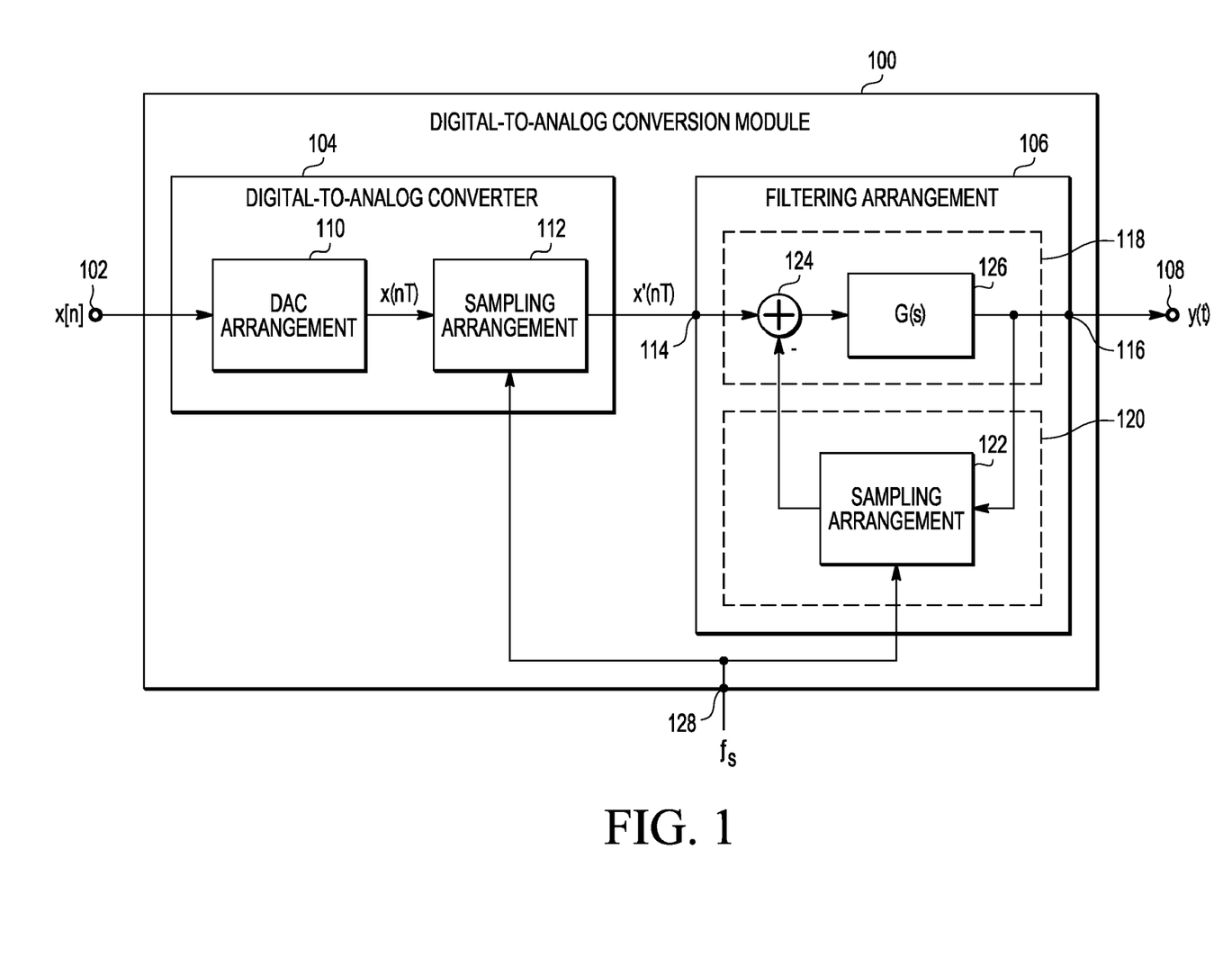
FIG. 1 is a block diagram of a digital-to-analog conversion module in accordance with one embodiment of the invention.

FIG. 1 depicts an exemplary embodiment of a digital-to-analog conversion module 100 suitable for converting an input digital signal (or sequence of digital values) to a continuous-time analog signal. In an exemplary embodiment, the DAC module 100 includes, without limitation, an input 102 for receiving a digital signal (x[n]), a digital-to-analog converter (DAC) 104, a filtering arrangement 106, and an output node 108. As described in greater detail below, the elements of the DAC module 100 are suitably configured to convert the digital signal (x[n]) at the input 102 to a continuous-time analog output signal (y(t)) at the output node 108. It should be understood that FIG. 1 is a simplified diagram of the DAC module 100 and is not intended to limit the scope of the subject matter described herein.

In an exemplary embodiment, the DAC 104 is coupled to the input 102 and converts the digital signal (x[n]) at the input 102 into a discrete-time analog signal (x'(nT)) at the output of the DAC 104 having a sampling rate corresponding to a sampling frequency $$\left(f_s = \frac{1}{T}\right)$$

of the DAC 104. The filtering arrangement 106 is coupled between the output of the DAC 104 and the output node 108, and the filtering arrangement 106 is configured to convert the discrete-time analog signal (x'(nT)) at the output of the DAC 104 to the continuous-time analog output signal (y(t)) at the output node 108, as described in greater detail below. In an exemplary embodiment, the filtering arrangement 106 functions as an image rejection filter (or reconstruction filter) that removes image components of the digital signal (x[n]) that are aliased to integer multiples of the sampling frequency ($f_s$).

In an exemplary embodiment, the DAC 104 includes a digital-to-analog conversion arrangement 110 and a sampling arrangement 112. The DAC arrangement 110 receives the digital signal (x[n]) and generates an analog signal level (or analog value) that is representative of the digital signal (x[n]). In an exemplary embodiment, the sampling arrangement 112 is realized as a sample and hold arrangement (or alternatively, a sample and hold circuit) comprising a sampling element and a hold arrangement configured to provide a zero-order hold, as described in greater detail below. The sampling element samples the output of the DAC arrangement 110 at the sampling frequency ($f_s$) to obtain a discrete-time analog value, wherein the discrete-time analog value is held by the hold arrangement for the duration of the sampling interval $$\left(\text{e.g., } T \text{ or } \frac{1}{f_s}\right)$$

to obtain the discrete-time analog signal having a sampling rate of ($f_s$), as will be appreciated in the art.

In an exemplary embodiment, the filtering arrangement 106 includes an input 114, an output 116, a forward signal arrangement 118, and a feedback signal arrangement 120. The input 114 is coupled to the output of the DAC 104 and receives the discrete-time analog signal (x'(nT)) from the DAC 104. The output 116 is coupled to the output node 108 and produces a continuous-time analog output signal (y(t)) at the output node 108 that is based on the discrete-time analog signal (x'(nT)) at the input 114, as described in greater detail below. The feedback signal arrangement 120 generates a discrete-time feedback signal at an input summing junction 124 of the forward signal arrangement 118 that is subtracted from the discrete-time analog signal (x'(nT)) at the input 114, as described in greater detail below. In an exemplary embodiment, the feedback signal arrangement 120 is operated synchronously with the sampling arrangement 112 (e.g., the sampling by both feedback signal arrangement 120 and the sampling arrangement 112 is synchronized in time) such that the discrete-time feedback signal has the same sampling rate as the discrete-time analog signal and there is little or no time delay (or phase offset) between the discrete-time feedback signal and the discrete time analog signal, as described in greater detail below. The forward signal arrangement 118 includes an input summing junction 124 and a continuous-time feedforward filtering arrangement 126. The continuous-time feedforward filtering arrangement 126 represents the combination of elements coupled between the input summing junction 124 and the output 116 which are suitably configured to generate the continuous-time analog output signal (y(t)) based on the difference between the discrete-time analog signal and the discrete-time feedback signal from the feedback signal arrangement 120. In an exemplary embodiment, the continuous-time feedforward filtering arrangement 126 is realized with continuous-time circuitry and may be realized with any order and using any suitable topology, such as, for example, a cascade topology, a quadrature or complex topology, and the like. Thus, the continuous-time feedforward filtering arrangement 126 generates the continuous-time analog output signal (y(t)) based on the signal from the input summing junction 114 without any sampling.

In an exemplary embodiment, the feedback signal arrangement 120 includes a sampling arrangement 122 configured to generate the discrete-time feedback signal by sampling one or more continuous-time analog signals from the forward signal arrangement 118, as described in greater detail below. The sampling arrangement 122 samples the one or more continuous-time analog signal(s) from the forward signal arrangement 118 at a sampling frequency ($f_s$) that corresponds to the sampling rate of the discrete-time analog signal (x'(nT)), as described in greater detail below. In an exemplary embodiment, the sampling arrangement 122 is realized as a sample and hold arrangement, however, in alternative embodiments, the sampling arrangement 122 may be realized or implemented with a discrete-time filter or digital filter, such as a finite impulse response (FIR) filter or an infinite impulse response (IIR) filter. For example, a discrete-time integrator includes a sample and hold circuit, and therefore, in a practical circuit-level implementation, it may be easier and/or desirable to implement the sampling arrangement 122 using a discrete-time filter (e.g., a discrete-time integrator) than as a standalone sample and hold circuit because the discrete time integrator may be implemented with reduced complexity, area, power, and/or sensitivity to component variations.

In an exemplary embodiment, the sampling arrangement 122 is synchronized with the DAC 104 and/or sampling arrangement 112. In this regard, in accordance with one or more embodiments, the DAC module 100 includes a clock input 128 that receives a clock signal having the sampling frequency ($f_s$). The clock input 128 is coupled to the sampling arrangement 112 of the DAC 104 and the sampling arrangement 122 of the filtering arrangement 106 and provides the clock signal to the sampling arrangements 112, 122, such that both sampling arrangements 112, 122 operate at the same sampling frequency ($f_s$). In this regard, in response to a transition of the clock signal, the sampling arrangement 112 of the DAC 104 samples and holds the signal from the DAC arrangement 110 and the sampling arrangement 122 of the feedback signal arrangement 120 simultaneously (i.e., within realistic and/or practical operating tolerances) samples and holds the one or more continuous-time analog signals from the forward signal arrangement 118, such that the discrete-time analog signal (x'(nT)) and the discrete-time feedback signal at the input summing junction 124 have the identical sampling rate and substantially zero time delay (e.g., within realistic and/or practical operating tolerances). In this manner, the discrete-time analog signal and the discrete-time feedback signal are synchronized in time, that is, the signals have the same sampling rate and negligible time delay.

It should be noted that the transfer function for the filtering arrangement 106 is equal to $$\frac{G(s)H(s)}{1+GH^*},$$

where G(s) is the transfer function of the feedforward filtering arrangement 126, H(s) is the transfer function of the feedback signal arrangement 120 and/or sampling arrangement 122, and GH* is the z-transform of G(s)H(s). As described in greater detail below, G(s) may be designed to include poles near zero frequency while $$\frac{1}{1+GH^*}$$

includes zeros at the poles of G(s) and integer multiples of the sampling frequency ($f_s$). As a result, by virtue of the transfer function of the filtering arrangement 106, the zero frequency poles and zero frequency zeros cancel each other out, leaving zeros at integer multiples of the sampling frequency ($f_s$). This results in a frequency response for the filtering arrangement 106 that is relatively flat a low frequencies with zeros and/or notches at integer multiples of the sampling frequency ($f_s$), thereby rejecting images of the low frequency components that are aliased by virtue of the digital-to-analog conversion. As described in greater detail below, the filtering arrangement 106 may be configured such that the zeros and/or notches of the transfer function near integer multiples of the sampling frequency ($f_s$) have a desired bandwidth and attenuation for a particular application.

Figure 2:
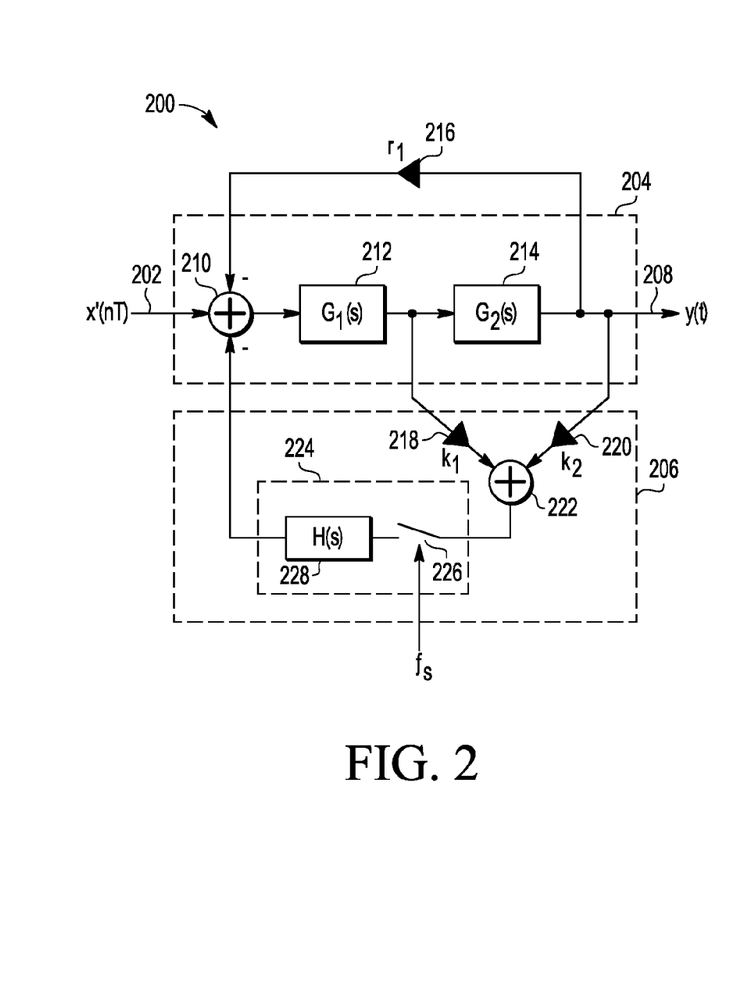
FIG. 2 is a block diagram of a filtering arrangement suitable for use in the digital-to-analog conversion module of FIG. 1 in accordance with one embodiment of the invention.

FIG. 2 depicts an exemplary embodiment of a second order filtering arrangement 200 suitable for use as the filtering arrangement 106 of the DAC module 100 of FIG. 1. The illustrated embodiment of the filtering arrangement 200 includes, without limitation, an input 202 for receiving a discrete-time analog input signal (x'(nT)) having a sampling rate ($f_s$), a forward signal arrangement 204, a feedback signal arrangement 206, and an output 208. It should be understood that FIG. 2 is a simplified diagram of the filtering arrangement 200 and is not intended to limit the scope of the subject matter described herein. Thus, although FIG. 2 depicts direct electrical connections between circuit elements, alternative embodiments may employ intervening circuit elements and/or components while functioning in a substantially similar manner.

In the illustrated embodiment, the forward signal arrangement 204 is realized using a second order topology. The forward signal arrangement 204 includes an input summing junction 210, a first integrator 212, and a second integrator 214. The input of the first integrator 212 is coupled to the input summing junction 210 and the input of the second integrator 214 is coupled to the output of the first integrator 212. In an exemplary embodiment, the integrators 212, 214 are realized using continuous-time circuitry and each integrator 212, 214 is configured to generate a continuous-time analog signal at its output based on a signal at its input. In this regard, the first integrator 212 integrates the resulting signal at the input summing junction 210, resulting in a first continuous-time analog signal at its output, and the second integrator 214 integrates the first continuous-time analog signal at the output of the first integrator 212 which results in the continuous-time analog output signal (y(t)). In an exemplary embodiment, the filtering arrangement 200 includes a electronic element 216 coupled between the output of the second integrator 214 and the input summing junction 210 and configured as a resonator such that the electronic element 216 generates a resonance feedback signal that is subtracted from the input signal (x'(nT)) at the input summing junction 210. In accordance with one embodiment, the electronic element 216 is realized as a resistor, however, in other embodiments, the electronic element 216 may be realized as a transconductor. As described in greater detail below, the resonance feedback signal has the effect of spreading the zeros in the transfer function of the filtering arrangement 200 around integer multiples of the sampling frequency to create notches in the filter frequency response having a wider effective bandwidth of attenuation (or alternatively, the image rejection bandwidth).

In an exemplary embodiment, the feedback signal arrangement 206 generates a discrete-time feedback signal at the input summing junction 210 of the forward signal arrangement 204 based on one or more continuous-time analog signals from the forward signal arrangement 204. In the illustrated embodiment, the feedback signal arrangement 206 comprises a plurality of electronic elements 218, 220, a feedback summing junction 222, and a sampling arrangement 224. In the illustrated embodiment, the sampling arrangement 224 is realized as a sample and hold arrangement comprises a sampling element 226 and a hold arrangement 228, as described in greater detail below. In an exemplary embodiment, the output of each integrator 212, 214 is coupled to the input of the sampling arrangement 224 and/or sampling element 226 via a feedback summing junction 222. The sampling arrangement 224 and/or sampling element 226 samples the sum of the continuous-time analog signals at the integrator outputs at a sampling frequency ($f_s$) that corresponds to the sampling rate of the discrete-time analog input signal (x'(nT)) at the input node 202 of the filtering arrangement 200, as set forth above in the context of FIG. 1.

In an exemplary embodiment, each electronic element 218, 220 is coupled between an output of a respective integrator 212, 214 of the forward signal arrangement 204 and the input of the sampling arrangement 224 via the feedback summing junction 222. As shown, the first electronic element 218 is coupled between the output of the first integrator 212 and the feedback summing junction 222 and is configured to multiply the first continuous-time analog signal at the output of the first integrator 212 by a gain factor (or gain coefficient) of $k_1$, while the second electronic element 220 is coupled between the output of the second integrator 214 and the feedback summing junction 222 and is configured to multiply the second continuous-time analog signal at output of the second integrator 214 (e.g., the continuous-time analog output signal (y(t))) by a gain factor of $k_2$.

In the illustrated embodiment, the sampling arrangement 224 is coupled between the feedback summing junction 222 and the input summing junction 210 and the sampling arrangement 224 generates the discrete-time feedback signal at the input summing junction 210 by sampling the sum of the continuous-time analog signals at the integrator outputs at the feedback summing junction 222 with at sampling frequency ($f_s$). The input summing junction 210 provides the difference between the discrete-time analog input signal (x'(nT)), the discrete-time feedback signal, and the resonance feedback signal to the input of the first integrator 212 which generates the first continuous-time analog signal at its output by integrating the difference signal from the input summing junction 210, and the second integrator 214 integrates the continuous-time analog signal at the output of the first integrator 212 to obtain the continuous-time analog output signal (y(t)).

As shown in FIG. 1, in an exemplary embodiment, the sampling arrangement 224 is realized as a sample and hold arrangement comprising a sampling element 226 and a hold arrangement 228. In an exemplary embodiment, the sampling element 226 is realized as a switch that is operated at the sampling frequency ($f_s$). The hold arrangement 228 is coupled between the sampling element 226 and the input summing junction 210 and the hold arrangement 228 is configured to hold the sampled value from the sampling element 226 in a conventional manner. In the exemplary embodiment, the hold arrangement 228 is configured to provide a zero-order hold, that is, the hold arrangement 228 holds the sampled value for one sampling interval $$\left(\frac{1}{f_s}\right),$$

as will be appreciated in the art. Depending on the embodiment, the hold arrangement 228 may be realized as a capacitor, a current source, or with other suitable hold circuitry. In practice, the sampling arrangement 224 and electronic elements 218, 220, may be implemented in an integral manner by using switched capacitors or switched current sources as electronic elements 218, 220, as will be appreciated in the art.

In an exemplary embodiment, the integrators 212, 214 are realized using continuous-time circuitry and the filtering arrangement 200 is configured such that the output of the second integrator 214 is a continuous-time analog output signal (y(t)) that corresponds to an interpolated version of the discrete-time analog input signal (x'(nT)). In this regard, to achieve image rejection over wider frequency bandwidth (e.g., a wider effective notch at integer multiples of the sampling frequency), it is possible to spread the zeros of the filter transfer function by setting $$\frac{1}{1+GH^*} = 1 - \alpha z^{-1} + z^{-2},$$

which corresponds to a symmetric finite impulse response (FIR) filter having a linear phase response. This leads to a desired transfer function for the filtering arrangement 200 of $$\left(\frac{1 - \alpha z^{-1} + z^{-2}}{s^2 + \omega_0^2}\right)\left(\frac{1 - z^{-1}}{s}\right),$$

with $\alpha$ being optimized for a desired effective notch bandwidth (or image rejection bandwidth). For example, in accordance with one embodiment, $\alpha$ is chosen such that the image rejection bandwidth corresponds to twice the bandwidth of the input signal. The gain factors ($k_1$, $k_2$) of the feedback signal arrangement 206 and the gain factor ($r_1$) of the resonator 216 are calculated to achieve the desired transfer function for the filtering arrangement 200 that results in the desired frequency roll-off, image rejection bandwidth and/or attenuation at integer multiples of the sampling frequency, as will be appreciated in the art.

Figure 3:
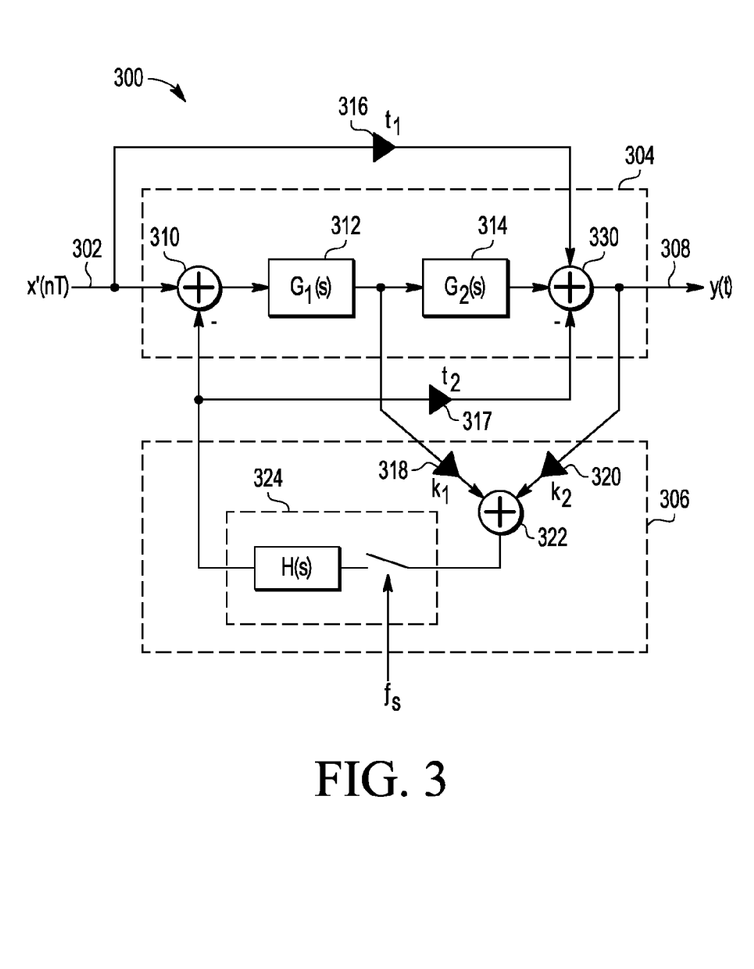
FIG. 3 is a block diagram of a filtering arrangement suitable for use in the digital-to-analog conversion module of FIG. 1 in accordance with another embodiment of the invention.

FIG. 3 depicts another embodiment of a second order filtering arrangement 300 suitable for use as the filtering arrangement 106 of the DAC module 100 of FIG. 1. The illustrated embodiment of FIG. 3, the filtering arrangement 300 includes, without limitation, an input 302 for receiving a discrete-time analog input signal (x'(nT)) having a sampling rate ($f_s$), a forward signal arrangement 304, a feedback signal arrangement 306, and an output 308. The elements of the filtering arrangement 300 are similar to counterpart elements discussed above in the context of filtering arrangement 200 of FIG. 2, and as such, these common elements will not be redundantly described in detail here in the context of FIG. 3. It should be understood that FIG. 3 is a simplified diagram of the filtering arrangement 300 and is not intended to limit the scope of the subject matter described herein. Thus, although FIG. 3 depicts direct electrical connections between circuit elements, alternative embodiments may employ intervening circuit elements and/or components while functioning in a substantially similar manner.

In the illustrated embodiment, the filtering arrangement 300 includes electronic elements 316, 317. As described in greater detail below, the electronic elements 316, 317 have the effect of establishing or otherwise creating a transmission zero, that is, an additional non-periodic zero (e.g., a continuous-time zero) at a particular frequency in the transfer function of the filtering arrangement 300. As shown, electronic element 316 is coupled to the input 302 and configured to multiply the discrete-time analog input signal (x'(nT)) by a gain factor of $t_1$ and provide the result to an output summing junction 330, while electronic element 317 is coupled to the sampling arrangement 324 and configured to multiply the discrete-time feedback signal by a gain factor of $t_2$ and provides the result to the output summing junction 330. The output summing junction 330 is coupled to the output of the second integrator 314 and is configured to add the difference between the signal from the first electronic element 316 and the signal from the second electronic element 317 to the output of the second integrator 314 to produce the continuous-time analog output signal (y(t)) at the output 308. In an exemplary embodiment, the feedback signal arrangement 306 includes a electronic element 320 coupled to the output of the output summing junction 330 that is configured to multiply the output of the output summing junction 330 by a gain factor of $k_2$. It should be noted that in practical circuit level implementations, the output summing junction 330 may be implemented and/or merged with the output of the second integrator 314, such that electronic element 320 effectively multiplies the output of the second integrator 314 (e.g., continuous-time analog output signal (y(t))) by the gain factor of $k_2$ and provides the result to the feedback summing junction 322.

In accordance with one embodiment, the filtering arrangement 300 is configured such that the filtering arrangement 300 has linear phase response. For example, in accordance with one embodiment, transfer function of the filtering arrangement 300 is chosen to be equal to $$(1 - \alpha z^{-1} + z^{-2})\left(\frac{as^2 + 1}{s^2 + \omega_0^2 s}\right)\left(\frac{1 - z^{-1}}{s}\right),$$

which achieves linear phase response. It should be noted that the gain factors for electronic elements 316, 317 ($t_1$, $t_2$) may be adjusted such that the transmission zero is located at a frequency that achieves the desired image rejection bandwidth and/or attenuation. For example, in accordance with one embodiment, the gain factors ($t_1$, $t_2$) are selected such that the electronic elements 316, 317 create an additional zero at the sampling frequency ($f_s$). In accordance with one embodiment, the gain factors for the electronic elements 316, 317 are equal (e.g., $t_1 = t_2$) and $\alpha < 2$.

Figure 4:
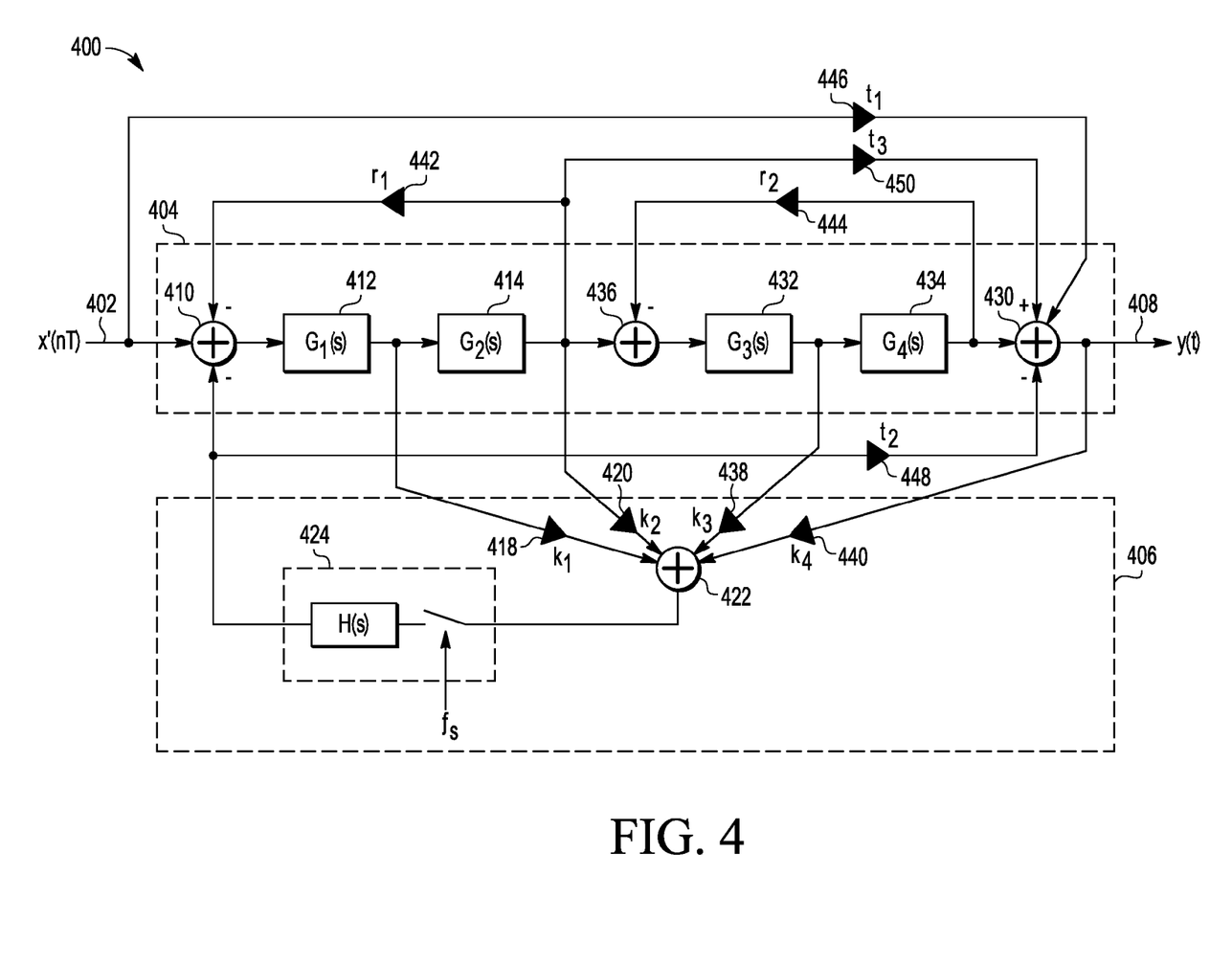
FIG. 4 is a block diagram of a filtering arrangement suitable for use in the digital-to-analog conversion module of FIG. 1 in accordance with yet another embodiment of the invention.

FIG. 4 depicts an exemplary embodiment of a fourth order filtering arrangement 400 suitable for use as the filtering arrangement 106 of the DAC module 100 of FIG. 1. The illustrated embodiment of the filtering arrangement 400 includes, without limitation, an input 402 for receiving a discrete-time analog input signal (x'(nT)) having a sampling rate ($f_s$), a forward signal arrangement 404, a feedback signal arrangement 406, and an output 408. The elements of the filtering arrangement 400 are similar to counterpart elements discussed above in the context of filtering arrangement 200 of FIG. 2 and filtering arrangement 300 of FIG. 3, and as such, these common elements will not be redundantly described in detail here in the context of FIG. 4. It should be understood that FIG. 4 is a simplified diagram of the filtering arrangement 400 and is not intended to limit the scope of the subject matter described herein. Thus, although FIG. 4 depicts direct electrical connections between circuit elements, alternative embodiments may employ intervening circuit elements and/or components while functioning in a substantially similar manner.

In the illustrated embodiment, the forward signal arrangement 404 is realized using a fourth order feedforward topology. The forward signal arrangement 404 includes an input summing junction 410, an intermediate summing junction 436, four integrators 412, 414, 432, 434, and an output summing junction 430. The input of the first integrator 412 is coupled to the output of the input summing junction 410 and the input of the second integrator 414 is coupled to the output of the first integrator 412. In the illustrated embodiment, the input of the third integrator 432 is coupled to the output of the second integrator 414 via the intermediate summing junction 436, and the input of the fourth integrator 434 is coupled to the output of the third integrator 432. The output of the fourth integrator 434 is coupled to the output 408 via the output summing junction 430.

As shown in FIG. 4, in an exemplary embodiment, the feedback signal arrangement 406 comprises four electronic elements 418, 420, 438, 440 with each electronic element 418, 420, 438, 440 being coupled between an output of a respective integrator 412, 414, 432, 434 of the forward signal arrangement 404 and the input of a sampling arrangement 424 via the feedback summing junction 422. In this regard, the fourth electronic element 440 may be coupled to the output of the fourth integrator 434 via the output summing junction 430, which in turn, may be implemented and/or merged with the fourth integrator 434, as will be appreciated in the art and described above in the context of output summing junction 330 of FIG. 3. As set forth above in the context of FIG. 1, the sampling arrangement 424 is operated at a sampling frequency ($f_s$) that corresponds to the sampling rate of the discrete-time analog input signal at the input 402 of the filtering arrangement 400.

In an exemplary embodiment, the filtering arrangement 400 is configured such that the output of the fourth integrator 434 is a continuous-time analog output signal (y(t)) that represents an interpolated version of the discrete-time analog input signal (x'(nT)). To achieve a wider image rejection bandwidth (e.g., a wider effective notch at integer multiples of the sampling frequency) and/or greater attenuation at integer multiples of the sampling frequency, the filtering arrangement 400 includes resonators to spread the zeros in the transfer function of the filtering arrangement 400 and transmission zeros that add zeros to the transfer function of the filtering arrangement 400 at desired frequencies. In this regard, in the illustrated embodiment of FIG. 4, the filtering arrangement 400 includes a electronic element 442 coupled between the output of the second integrator 414 and the input summing junction 410 and configured as a resonator such that the electronic element 442 generates a resonance feedback signal that is subtracted from the input signal (x'(nT)) at the input summing junction 410. A second electronic element 444 is coupled between the output of the fourth integrator 434 and the input of the third integrator 432 via intermediate summing junction 436 and configured as a resonator such that the electronic element 444 generates a second resonance feedback signal that is subtracted from the output of the second integrator 414 at the intermediate summing junction 436. In addition, the filtering arrangement 400 includes a plurality of electronic elements 446, 448, 450 configured to establish or otherwise create transmission zeros in the transfer function of the filtering arrangement 400. As shown, electronic element 446 is coupled to the input 402 and configured to multiply the discrete-time analog input signal (x'(nT)) by a gain factor of $t_1$ and provide the result to the output summing junction 430, electronic element 448 is coupled to the output of the sampling arrangement 424 and configured to multiply the discrete-time feedback signal by a gain factor of $t_2$ and provides the result to the output summing junction 430, and electronic element 450 is coupled to the output of the second integrator 414 and configured to multiply the output of the second integrator by a gain factor of $t_3$ and provides the result to the output summing junction 430. The output summing junction 430 is configured to add the signals from the electronic elements 446, 450 and the output of the fourth integrator 434 and subtract from the resulting sum the signal from electronic element 448 to produce the continuous-time analog output signal (y(t)) at the output 408.

Figure 5:
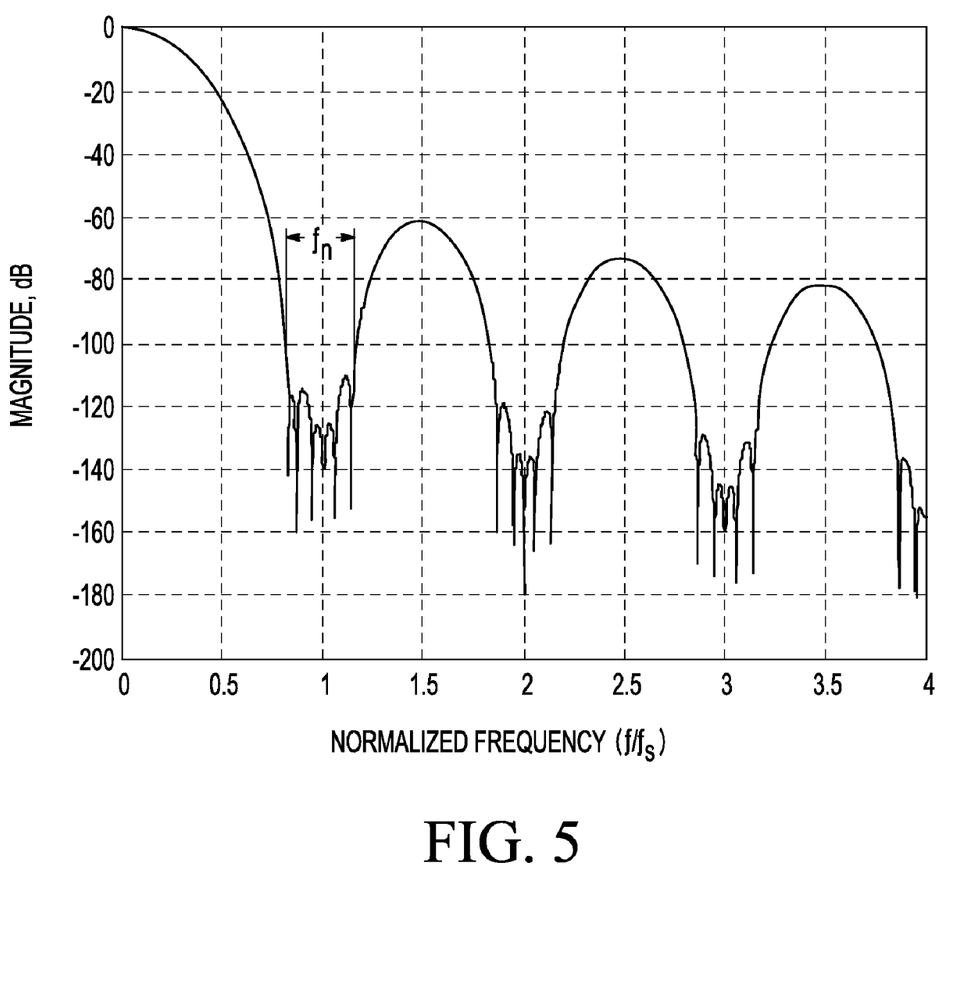
FIG. 5 is a graph depicting the frequency response of the filtering arrangement of FIG. 4 in accordance with one embodiment of the invention.

Referring now to FIG. 5 with continued reference to FIG. 4, in an exemplary embodiment, the gain factors of the filtering arrangement 400 (e.g., $k_1$-$k_4$, $r_1$-$r_2$, and $t_1$-$t_3$) are calculated or otherwise chosen to achieve a desired transfer function for the filtering arrangement 400. For example, FIG. 5 depicts a frequency response for an exemplary embodiment of the filtering arrangement 400 with gain factors chosen such that the transfer function of the filtering arrangement 400 is equal to $$(1 - \alpha z^{-1} + \beta z^{-2} - \alpha z^{-3} + z^{-4})\left(\frac{bs^4 + as^2 + 1}{s^4 + ks^2 + \omega_0^2}\right)\left(\frac{1-z^{-1}}{s}\right),$$

which exhibits a linear phase response. As shown in FIG. 5, the filtering arrangement 400 achieves relatively flat frequency response and/or relatively limited frequency roll-off at low frequencies while at the same time achieving zeros and/or notches at integer multiples of the sampling frequency that result in a relatively wide image rejection bandwidth ($f_n$) with a relatively high attenuation. The transfer function of the filtering arrangement 400 creates seven zeros positioned around the sampling frequency (i.e., normalized frequency of 1) that result in an image rejection bandwidth (or effective notch bandwidth) of about one-third of the sampling frequency ($f_s$) and an attenuation of about −110 dB. In an exemplary embodiment, the image rejection bandwidth ($f_n$) corresponds to twice the bandwidth of the input signal, as will be appreciated in the art. As shown, the transmission zeros added to the transfer function about the sampling frequency are non-periodic, such that the transfer function results in five zeros positioned around the remaining integer multiples of the sampling frequency. It should be noted that the gain factors of the filtering arrangement 400 ($k_1$-$k_4$, $r_1$-$r_2$, and $t_1$-$t_3$) may be modified to spread the zeros and achieve a wider image rejection bandwidth ($f_n$) in terms of the percentage of the sampling frequency, thereby allowing equivalent image rejection performance to be achieved using a lower sampling frequency, which reduces power consumption. Conversely, the gain factors of the filtering arrangement 400 ($k_1$-$k_4$, $r_1$-$r_2$, and $t_1$-$t_3$) may be modified to reduce the image rejection bandwidth and achieve a greater attenuation at integer multiples of the sampling frequency.

One advantage of the systems and/or methods described above is that the image rejection filter may achieve a relatively wide image rejection bandwidth with a relatively low sampling frequency using filtering arrangements having a lower order lower order (e.g., fewer number of integrators) and without using additional DAC elements. As a result, the desired image rejection may be achieved with reduced cost and/or power consumption. The continuous-time elements of the image rejection filter may be implemented using gm-c, active RC, passive RC, or another suitable implementation technique. Furthermore, resonators and/or transmission zeros may be used to achieve any number and/or configuration of zeros, and the transfer function of the filtering arrangement may be designed for linear phase response.

Systems, devices, and methods configured in accordance with example embodiments of the subject matter relate to:

An apparatus is provided for a module for converting a digital signal to a continuous-time analog output signal. The module comprises a digital-to-analog converter and a filtering arrangement coupled between the digital-to-analog converter and an output node. The digital-to-analog converter is configured to convert the digital signal to a discrete-time analog signal having a first sampling rate. The filtering arrangement comprises a forward signal arrangement having an input configured to receive the discrete-time analog signal and a feedback signal arrangement coupled to the forward signal arrangement. The feedback signal arrangement is configured to generate a discrete-time feedback signal at the input of the forward signal arrangement based on one or more continuous-time analog signals from the forward signal arrangement, the discrete-time feedback signal having the first sampling rate, wherein the forward signal arrangement generates the continuous-time analog output signal at the output node based on a difference between the discrete-time analog signal and the discrete-time feedback signal. In accordance with one embodiment, the forward signal arrangement comprises a plurality of integrators coupled between the input and the output node, with each integrator being configured to generate a continuous-time analog signal at its output, resulting in a plurality of continuous-time analog signals. The feedback signal arrangement is configured to generate the discrete-time feedback signal by sampling a sum of the plurality of continuous-time analog signals from the plurality of integrators with the first sampling rate.

In accordance with one embodiment, the digital-to-analog converter comprises a digital-to-analog conversion arrangement configured to produce an analog signal based on the digital signal and a first sampling arrangement configured to generate the discrete-time analog signal by sampling the analog signal with the first sampling rate. In a further embodiment, the first sampling arrangement is configured sample the analog signal in response to a clock signal having the sampling frequency and the feedback signal arrangement comprises a second sampling arrangement configured to sample the one or more continuous-time analog signals from the forward signal arrangement in response to the clock signal. In another embodiment, the feedback signal arrangement comprises a sampling arrangement coupled between the output node and the input, wherein the sampling arrangement is configured to generate the discrete-time feedback signal with the first sampling rate. In accordance with one or more embodiments, the digital-to-analog converter and the sampling arrangement are configured to operate synchronously. In one embodiment, the feedback signal arrangement comprises a sample and hold arrangement. In accordance with another embodiment, the feedback signal arrangement comprises a discrete-time filter configured to operate with the first sampling rate. In a further embodiment, the discrete-time filter comprises a discrete-time integrator.

In accordance with another embodiment, an apparatus is provided for a filtering arrangement. The filtering arrangement comprises an input for receiving a discrete-time analog signal, an output, a forward signal arrangement coupled between the input and the output, and a feedback signal arrangement coupled to the forward signal arrangement. The feedback signal arrangement is configured to generate a discrete-time feedback signal based on one or more continuous-time analog signals from the forward signal arrangement. The forward signal arrangement generates a continuous-time analog output signal at the output based on a difference between the discrete-time analog signal and the discrete-time feedback signal. In one embodiment, the discrete-time analog signal has a first sampling rate, wherein the feedback signal arrangement is configured to generate the discrete-time feedback signal with the first sampling rate. In a further embodiment, the discrete-time feedback signal and the discrete-time analog signal are synchronized. In another embodiment, the forward signal arrangement comprises a feedforward filtering arrangement. In accordance with one or more embodiments, the forward signal arrangement comprises one or more integrators coupled between the input and the output, with each integrator being configured to generate a respective continuous-time analog signal of the one or more continuous-time analog signals at its output. The feedback signal arrangement obtains the discrete-time feedback signal by sampling a sum of the one or more continuous-time analog signals with a first sampling rate equal to the sampling rate of the discrete-time analog signal.

In yet another embodiment, the feedback signal arrangement comprises a sampling element configured to sample a sum of the one or more continuous-time analog signals with the first sampling rate corresponding to the sampling rate of the discrete-time analog signal, resulting in a sampled value. The feedback signal arrangement further comprises a hold arrangement coupled between the sampling element and the forward signal arrangement. The hold arrangement is configured to hold the sampled value for a sampling interval corresponding to the sampling rate. In yet another embodiment, the filtering arrangement further comprises a resonator coupled to the forward signal arrangement. The resonator generates a resonance feedback signal, wherein the forward signal arrangement generates the continuous-time analog output signal based on the discrete-time analog signal, the discrete-time feedback signal, and the resonance feedback signal. In another embodiment, the filtering arrangement comprises a first element coupled between the input and the forward signal arrangement, wherein the first element establishes a zero at a particular frequency in the transfer function of the filtering arrangement.

In accordance with another embodiment, an apparatus is provided for a module comprising an output node, a first sampling arrangement, a forward signal arrangement, and a second sampling arrangement. The first sampling arrangement is configured to produce a discrete-time analog signal by sampling an analog signal at a first sampling frequency. The forward signal arrangement is coupled between the first sampling arrangement and the output node. The second sampling arrangement is coupled to the forward signal arrangement, and the second sampling arrangement is configured to generate a discrete-time feedback signal with the first sampling frequency based on one or more continuous-time analog signals from the forward signal arrangement, wherein the forward signal arrangement to generates a continuous-time analog output signal at the output node based on a difference between the discrete-time feedback signal and the discrete-time analog signal. In accordance with one embodiment, the first sampling arrangement and the second sampling arrangement are configured to operate synchronously. In another embodiment, the forward signal arrangement comprises a continuous-time feedforward filtering arrangement including one or more integrators coupled between the first sampling arrangement and the output node, each integrator being configured to generate a respective continuous-time analog signal of the one or more continuous-time analog signals at its output. The second sampling arrangement is coupled to the output of each integrator of the one or more integrators and generates the discrete-time feedback signal by sampling a sum of the one or more continuous-time analog signals at the first sampling frequency.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A module for converting a digital signal to a continuous-time analog output signal at an output node, the module comprising:
    a digital-to-analog converter configured to convert the digital signal to a discrete-time analog signal having a first sampling rate; and
    a filtering arrangement coupled between the digital-to-analog converter and the output node, the filtering arrangement comprising:
        a forward signal arrangement having an input configured to receive the discrete-time analog signal; and
        a feedback signal arrangement coupled to the forward signal arrangement, the feedback signal arrangement being configured to generate a discrete-time feedback signal at the input of the forward signal arrangement by sampling a sum of a plurality of continuous-time analog signals from the forward signal arrangement with the first sampling rate, wherein the forward signal arrangement generates the continuous-time analog output signal at the output node based on a difference between the discrete-time analog signal and the discrete-time feedback signal.

2. The module of claim 1, wherein the digital-to-analog converter comprises:
    a digital-to-analog conversion arrangement configured to produce an analog signal based on the digital signal; and
    a first sampling arrangement configured to generate the discrete-time analog signal by sampling the analog signal with the first sampling rate.

3. The module of claim 2, wherein:
    the first sampling arrangement is configured sample the analog signal in response to a clock signal having a sampling frequency corresponding to the first sampling rate; and
    the feedback signal arrangement comprises a second sampling arrangement configured to sample the sum of the plurality of continuous-time analog signals from the forward signal arrangement in response to the clock signal.

4. The module of claim 1, wherein the feedback signal arrangement comprises a sampling arrangement coupled between the output node and the input, the sampling arrangement being configured to generate the discrete-time feedback signal with the first sampling rate.

5. The module of claim 4, wherein the digital-to-analog converter and the sampling arrangement are configured to operate synchronously.

6. The module of claim 1, wherein the feedback signal arrangement comprises a sample and hold arrangement.

7. The module of claim 1, wherein the feedback signal arrangement comprises a discrete-time filter configured to operate with the first sampling rate.

8. The module of claim 7, wherein the discrete-time filter comprises a discrete-time integrator.

9. A filtering arrangement comprising:
    an input for receiving a discrete-time analog signal;
    an output;
    a forward signal arrangement coupled between the input and the output, the forward signal arrangement including a plurality of integrators coupled between the input and the output, each integrator being configured to generate a continuous-time analog signal at its output; and
    a feedback signal arrangement coupled to the forward signal arrangement, the feedback signal arrangement being configured to generate a discrete-time feedback signal based on a sum of a plurality of continuous-time analog signals from the forward signal arrangement, the plurality of continuous-time signals including at least one continuous-time analog signal from the output of at least one integrator of the plurality of integrators, wherein the forward signal arrangement generates a continuous-time analog output signal at the output based on a difference between the discrete-time analog signal and the discrete-time feedback signal.

10. The filtering arrangement of claim 9, the discrete-time analog signal having a first sampling rate, wherein the feedback signal arrangement is configured to generate the discrete-time feedback signal with the first sampling rate.

11. The filtering arrangement of claim 10, wherein the discrete-time feedback signal and the discrete-time analog signal are synchronized.

12. The filtering arrangement of claim 9, wherein the forward signal arrangement comprises a feedforward filtering arrangement.

13. The filtering arrangement of claim 9, the discrete-time analog signal having a first sampling rate, wherein
    the feedback signal arrangement obtains the discrete-time feedback signal by sampling the sum with the first sampling rate.

14. The filtering arrangement of claim 9, the discrete-time analog signal having a first sampling rate, wherein the feedback signal arrangement comprises:
    a sampling element configured to sample the sum with the first sampling rate, resulting in a sampled value; and
    hold arrangement coupled between the sampling element and the forward signal arrangement, the hold arrangement being configured to hold the sampled value for a sampling interval corresponding to the first sampling rate.

15. The filtering arrangement of claim 9, further comprising a resonator coupled to the forward signal arrangement, the resonator being configured to generate a resonance feedback signal, wherein the forward signal arrangement generates the continuous-time analog output signal based on the discrete-time analog signal, the discrete-time feedback signal, and the resonance feedback signal.

16. The filtering arrangement of claim 9, further comprising a first element coupled between the input and the forward signal arrangement, wherein the first element establishes a zero at a particular frequency in the transfer function of the filtering arrangement.

17. A module comprising:
an output node;
a first sampling arrangement configured to produce a discrete-time analog signal by sampling an analog signal at a first sampling frequency;
a continuous-time feedforward filtering arrangement including one or more integrators coupled between the first sampling arrangement and the output node, each integrator being configured to generate a respective continuous-time analog signal at its output; and
a second sampling arrangement coupled to the continuous-time feedforward filtering arrangement, the second sampling arrangement being configured to generate a discrete-time feedback signal with the first sampling frequency based on a sum of a plurality of continuous-time analog signals from the forward signal arrangement, the plurality of continuous-time signals including at least one continuous-time analog signal from the output of at least one integrator of the continuous-time feedforward filtering arrangement, wherein the continuous-time feedforward filtering arrangement generates a continuous-time analog output signal at the output node based on a difference between the discrete-time feedback signal and the discrete-time analog signal.

18. The module of claim 17, wherein the first sampling arrangement and the second sampling arrangement are configured to operate synchronously.

19. The module of claim 17, wherein
the second sampling arrangement is coupled to the output of each integrator of the one or more integrators and generates the discrete-time feedback signal by sampling a sum of the one or more continuous-time analog signals from the one or more integrators at the first sampling frequency.

20. A module for converting a digital signal to a continuous-time analog output signal at an output node, the module comprising:
a digital-to-analog converter configured to convert the digital signal to a discrete-time analog signal having a first sampling rate; and
a filtering arrangement coupled between the digital-to-analog converter and the output node, the filtering arrangement comprising:
a forward signal arrangement having an input configured to receive the discrete-time analog signal, the forward signal arrangement comprising a plurality of integrators coupled between the input and the output node, each integrator being configured to generate a continuous-time analog signal at its output, resulting in a plurality of continuous-time analog signals; and
a feedback signal arrangement coupled to the forward signal arrangement, the feedback signal arrangement being configured to generate a discrete-time feedback signal at the input of the forward signal arrangement by sampling a sum of the plurality of continuous-time analog signals from the plurality of integrators with the first sampling rate, wherein the forward signal arrangement generates the continuous-time analog output signal at the output node based on a difference between the discrete-time analog signal and the discrete-time feedback signal.

* * * * *